United States Patent
Gibson et al.

(10) Patent No.: US 6,275,406 B1
(45) Date of Patent: Aug. 14, 2001

(54) CONTENT ADDRESS MEMORY CIRCUIT WITH REDUNDANT ARRAY AND METHOD FOR IMPLEMENTING THE SAME

(75) Inventors: G. F. Randall Gibson, Nepean; Farhad Shafai; Jason E. Podaima, both of Kanata, all of (CA)

(73) Assignee: SiberCore Technologies, Inc., Ontario (CA)

(*) Notice: Subject to any disclaimer, the term of this patent is extended or adjusted under 35 U.S.C. 154(b) by 0 days.

(21) Appl. No.: 09/650,971

(22) Filed: Aug. 29, 2000

Related U.S. Application Data

(60) Provisional application No. 60/153,388, filed on Sep. 10, 1999, and provisional application No. 60/166,964, filed on Nov. 23, 1999.

(51) Int. Cl.$^7$ .................................................. G11C 15/00
(52) U.S. Cl. ........................................... 365/49; 365/200
(58) Field of Search .......................... 365/49, 200, 225.7

(56) References Cited

U.S. PATENT DOCUMENTS

| | | | |
|---|---|---|---|
| 4,475,194 | * 10/1984 | LaVallee et al. | 371/10 |
| 4,532,606 | 7/1985 | Phelps | 365/49 |
| 4,559,618 | 12/1985 | Houseman et al. | 365/49 |
| 4,622,653 | 11/1986 | McElroy | 365/49 |
| 4,646,271 | 2/1987 | Uchiyama et al. | 365/49 |
| 4,670,858 | 6/1987 | Almy | 365/49 |
| 4,723,224 | 2/1988 | Van Hulett et al. | 365/49 |
| 4,758,982 | 7/1988 | Price | 364/900 |
| 4,794,559 | 12/1988 | Greenberger | 365/49 |
| 4,996,666 | 2/1991 | Duluk, Jr. | 365/49 |
| 5,051,949 | 9/1991 | Young | 365/49 |
| 5,053,991 | * 10/1991 | Burrows | 365/49 |
| 5,319,589 | * 6/1994 | Yamagata et al. | 365/49 |
| 5,319,590 | 6/1994 | Montoye | 365/49 |
| 5,351,208 | 9/1994 | Jiang | 365/49 |
| 5,568,415 | 10/1996 | McLellan et al. | 365/49 |
| 5,608,662 | 3/1997 | Large et al. | 364/724.01 |
| 5,699,288 | 12/1997 | Kim et al. | 365/49 |
| 5,784,709 | 7/1998 | McLellan et al. | 711/207 |
| 5,828,593 | 10/1998 | Schultz et al. | 365/49 |
| 5,859,791 | 1/1999 | Schultz et al. | 365/49 |

* cited by examiner

*Primary Examiner*—Vu A. Le
*Assistant Examiner*—Anh Phung
(74) *Attorney, Agent, or Firm*—Martine & Penilla, LLP

(57) ABSTRACT

The present invention provides a CAM circuit having a redundant array and method for implementing the same. The circuit includes a first CAM array, a redundant CAM array, one or more storage devices, a first encoder, and a redundant encoder. The first CAM array stores data and has a plurality of first entries. Each first entry has a plurality of first memory cells, wherein any first entry that includes one or more defective first memory cells is defective. The redundant CAM array has one or more redundant entries of redundant memory cells. Each of the one or more redundant entries has a redundant address and is associated with a defective first entry, wherein each redundant entry is configured store data for the associated first entry. The one or more storage devices associate each of the defective first entries with a redundant entry. The first encoder outputs a first search result from the first CAM array while the redundant encoder outputs a redundant search result from the redundant CAM array according to a specified algorithm.

24 Claims, 4 Drawing Sheets

US 6,275,406 B1

CONTENT ADDRESS MEMORY CIRCUIT WITH REDUNDANT ARRAY AND METHOD FOR IMPLEMENTING THE SAME

CROSS REFERENCE TO RELATED APPLICATIONS

This application claims priority from U.S. Provisional Patent Application No. 60/153,388 filed Sep. 10, 1999, and entitled "Content Addressable Memory Circuitry" and from U.S. Provisional Patent Application No. 60/166,964 filed on Nov. 23, 1999, and entitled "Content Addressable Memory Circuit with Redundant Array and Method for Implementing the Same." These provisional applications are incorporated herein by reference.

BACKGROUND OF THE INVENTION

1. Field of the Invention

The present invention relates generally to memory circuits, and more particularly to content addressable memory circuits having redundant arrays for replacing defective entries.

2. Description of the Related Art

Memory devices are indispensable components of modem computer systems. As storage devices, they are used to provide fast access to data and instructions stored therein. Content addressable memory (CAM) is a special type of memory that is often used for performing address searches. For example, Internet routers often include a CAM for searching the address of specified data. The use of CAMs allows the routers to perform address searches to allow computer systems to communicate data with one another over networks. Besides routers, CAMs are also utilized in other areas such as database searches, image processing, and voice recognition applications.

FIG. 1A shows a block diagram of a conventional CAM 100. The CAM 100 includes a CAM array 102 and a control block 104. Additionally, the CAM 100 includes a data bus 106 for communicating data, an instruction bus 108 for transmitting instructions associated with an operation to be performed, and an output bus 110 for outputting a result of the operation. In a search operation, for example, the CAM 100 may output a result in the form of an address, pointer, or bit pattern corresponding to an entry that matches the input data.

In this configuration, the data bus 106 provides input data to the CAM array 102 while the instruction bus 108 provides CAM operation instructions to the control block 104. In response to an instruction, the control block 104 generates control signals for controlling the operations of the CAM array 102. At the end of a search operation, the CAM 100 outputs, on the result bus 110, an address, pointer, or bit pattern (collectively referred herein as "address") corresponding to an entry or word in the CAM array 102 that matches the input data on the data bus 106. For a read operation, on the other hand, the CAM 100 outputs on the result bus 106 data corresponding to the address provided on the instruction bus 108. CAMs are well known in the art and are described, for example, in U.S. Provisional Patent Applications, Nos. 60/153,388 and 60/167,155, which were previously incorporated by reference.

CAMs typically include a two-dimensional row and column content address memory array of core cells, such that each row contains an address, pointer, or bit pattern entry. Based on such array of cells, a CAM may perform "read" and "write" operations at specific addresses like a conventional random access memory (RAM). In addition, it may also perform "search" operations that simultaneously compare a bit pattern of data against an entire list (i.e., column) of pre-stored entries (i.e., rows) of bit patterns in the CAM array.

However, CAMs often become inoperable or unusable due to one or more defective cells. For example, a cell may become defective during the manufacturing process or operation of the CAMs. FIG. 1B illustrates a more detailed block diagram of the CAM array 102 showing a defective cell 170. The CAM array 102 includes a plurality of entries (e.g., rows, words) 152, 154, 156, 158, 160, 162, and 164. Each of the entries includes a plurality of core cells (e.g., memory cells) for storing data bits. For example, the entry 160 includes a plurality of core cells 166, 168, 170, 172, and 174, which are coupled to a match line (ml) 176. The match line 176 is asserted when all cells on the entry 160 matches those of input data. Each of the cells 166 to 174 is coupled to a word line (wl) and a pair of bit and complementary bit lines (bl and blbar). A encoder 150 is coupled to receive one or more search results such as search addresses from the CAM array 102. The encoder 150 then determines and outputs a search result having the highest priority. In the CAM array 102, the defective cell 170 in the entry 160 renders the entire entry 160 unusable. This is because the entry 160 can no longer produce a reliable result on its match line 176 when any of its cells is defective.

To increase manufacturing yield, other memory technologies such as SRAM and DRAM have provided redundant memory to replace the defective memory entries. That is, the redundant memory is used to store the data in lieu of a defective entry. Such techniques have typically provide fuses for the row decoders. The fuses for the defective rows are then blown to disable the defective rows, thereby preventing access to the defective rows.

In CAMs, however, implementing redundant address is not as simple as blowing a fuse for a row decoder. Unlike conventional SRAMs and DRAMs, the CAM array is generally configured for efficient search operations that output one or more search addresses. In addition, CAMs typically include a encoder for outputting a search address from one or more search addresses. Implementing redundancy in a CAM requires an intelligent encoder that knows that a defective entry has been replaced by a redundant entry for proper operation of the CAMs.

Furthermore, modem CAM array sizes have been increasing at a steady pace. While a typical CAM array size is 256 Kbit, some CAM arrays are approaching the size of 2 to 4 Mbits, which represents a substantial increase in size. For example, in routers, the large CAM array size allows storage of larger tables. However, the larger table size results in more complex packet forwarding schemes. In such critical applications, when a single cell is found to be defective, the entire chip becomes useless. Such defects thus have the undesirable effect of reducing yield and driving up the cost of the CAM chips.

In view of the foregoing, what is needed is a CAM circuit and method that provide redundancy with transparent mapping scheme without requiring complex encoder, thereby enhancing the yield of CAM chips with attendant savings in cost.

SUMMARY OF THE INVENTION

The present invention fills this need by providing a CAM circuit having a redundant array and methods for implementing the same. It should be appreciated that the present invention can be implemented in numerous ways, including as a process, an apparatus, a system, a device, or a method. Several embodiments of the present invention are described below.

In one embodiment, the present invention provides a CAM circuit having a redundant array. The circuit includes a first CAM array, a redundant CAM array, one or more storage devices, a first encoder, and a redundant encoder. The first CAM array stores data and has a plurality of first entries. Each first entry has a plurality of first memory cells, wherein any first entry that includes one or more defective first memory cells is defective. The redundant CAM array has one or more redundant entries of redundant memory cells. Each of the one or more redundant entries has a redundant address and is associated with a defective first entry, wherein each redundant entry is configured to store data for the associated first entry. The one or more storage devices, preferably one or more fuse banks, associate each of the defective first entries with a redundant entry. The first encoder outputs a first search result from the first CAM array while the redundant encoder outputs a redundant search result from the redundant CAM array.

In another embodiment, a CAM circuit with redundancy includes a primary CAM array, a redundant CAM array, one or more storage devices, a primary encoder, and a redundant encoder. The primary CAM array stores data and includes a plurality of primary entries. The primary entries are addressable by a plurality of primary addresses that defines a primary address space with one primary address being provided for each primary entry. The redundant CAM array includes a set of redundant entries, which are addressable by a set of redundant addresses that defines a redundant address space. One redundant address is provided for each redundant entry. Each redundant entry is configured to store data for a defective primary entry. The one or more storage devices store the redundant addresses and the primary addresses of one or more defective primary entries. In the one or more storage devices, the primary addresses of the defective primary entries are associated with the redundant addresses for mapping between the primary and redundant address spaces. The primary encoder is coupled to receive one or more primary addresses from the primary CAM array and outputs a selected primary address as a primary search result. The redundant encoder is coupled to receive one or more redundant addresses from the redundant CAM array and outputs a selected redundant address as a redundant search result Preferably, the CAM circuit further includes a primary address mapper, a redundant address mapper, and a secondary encoder. The primary address mapper converts an input address in the primary address space into an associated redundant address in the redundant address when the input address corresponds to a defective primary entry. The redundant address mapper converts the redundant search result into the associated defective primary entry so as to generate a second search result. The secondary encoder receives the primary and the second search results and then selects one of the search results as an output result.

In yet another embodiment, a method is disclosed for providing a redundant array for a CAM circuit. The CAM circuit includes a primary CAM array and a primary encoder. The primary CAM array has a plurality of primary entries for storing data. The primary entries are addressable by a plurality of primary addresses that defines a primary address space. One primary address is provided for each primary entry. The primary encoder is configured to output a selected primary address as a primary search result according to a specified algorithm. The method comprises: (a) providing a redundant CAM array having a set of redundant entries, the redundant entries being addressable by a set of redundant addresses that defines a redundant address space, one redundant address for each redundant entry, wherein each redundant entry is configured to store data for a defective primary entry; (b) storing the redundant addresses and the primary addresses of one or more defective primary entries in one or more storage devices, which associate the primary addresses of the defective primary entries with the redundant addresses for the primary and redundant address spaces; and (c) providing a redundant encoder coupled to receive one or more redundant addresses from the redundant CAM array and outputting a selected redundant address as a redundant search result according to the specified algorithm.

Advantageously, the present invention provides a redundant CAM array and a redundant encoder where the primary CAM and encoders are left undisturbed. In addition, the CAM circuit and method of the present invention perform address mapping transparently so that the encoder is not burdened with the task of keeping track of redundant addresses. Accordingly, the CAM circuit and method with the redundancy allow substantial increase in CAM chip yield with the attendant savings in cost. Other advantages of the invention will become apparent from the following detailed description, taken in conjunction with the accompanying drawings, illustrating by way of example the principles of the invention.

BRIEF DESCRIPTION OF THE DRAWINGS

The present invention will be readily understood by the following detailed description in conjunction with the accompanying drawings, wherein like reference numerals designate like structural elements.

DETAILED DESCRIPTION OF THE PREFERRED EMBODIMENTS

In the following description of the present invention, a content addressable memory circuit having a redundant array and methods for implementing the same, numerous specific details are set forth in order to provide a thorough understanding of the present invention. However, it will be obvious to one skilled in the art that the present invention may be practiced without some or all of these specific details. In other instances, well known process operations have not been described in detail in order not to unnecessarily obscure the present invention.

Figure 1A:
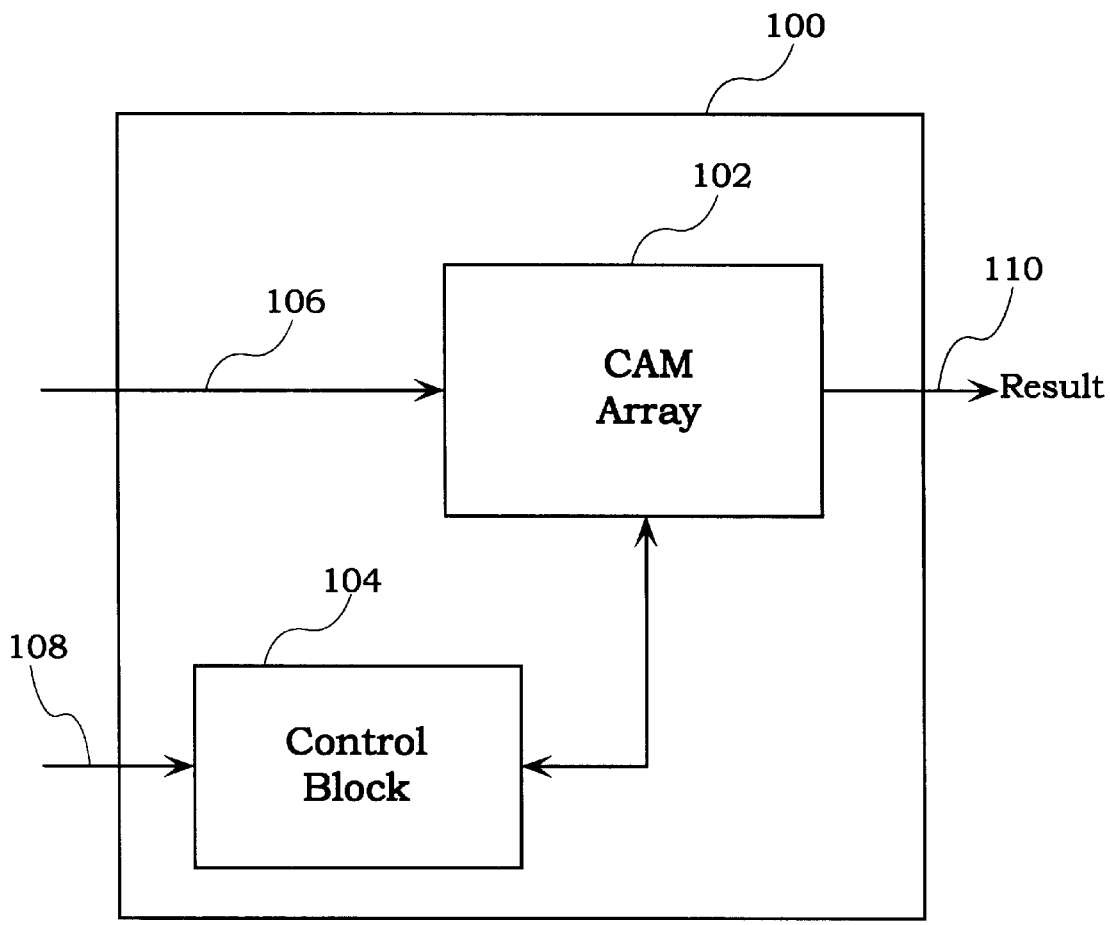
FIG. 1A shows a block diagram of a conventional content addressable memory (CAM).
Figure 1B:
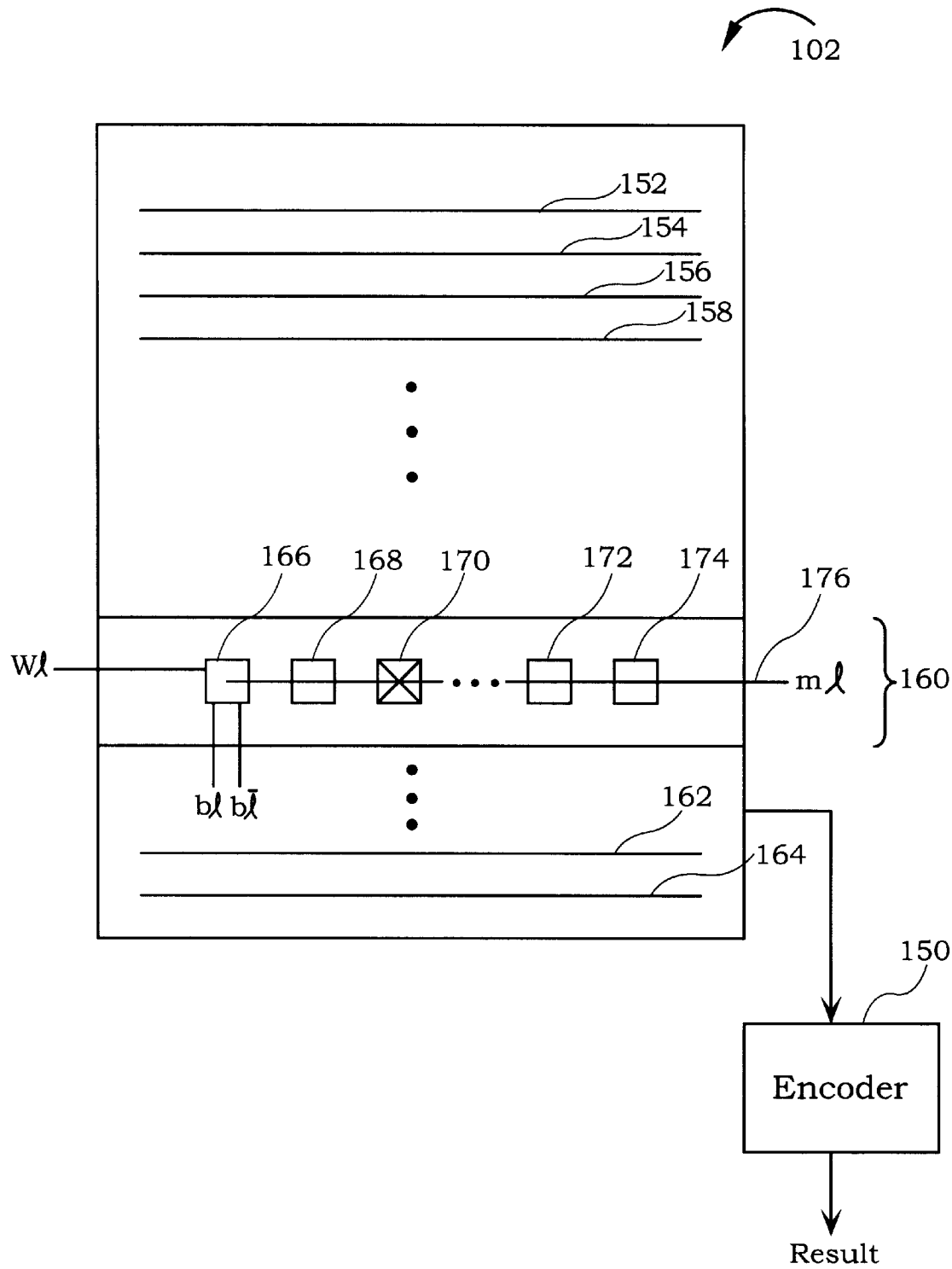
FIG. 1B illustrates a more detailed block diagram of a CAM array showing a defective cell.
Figure 2:
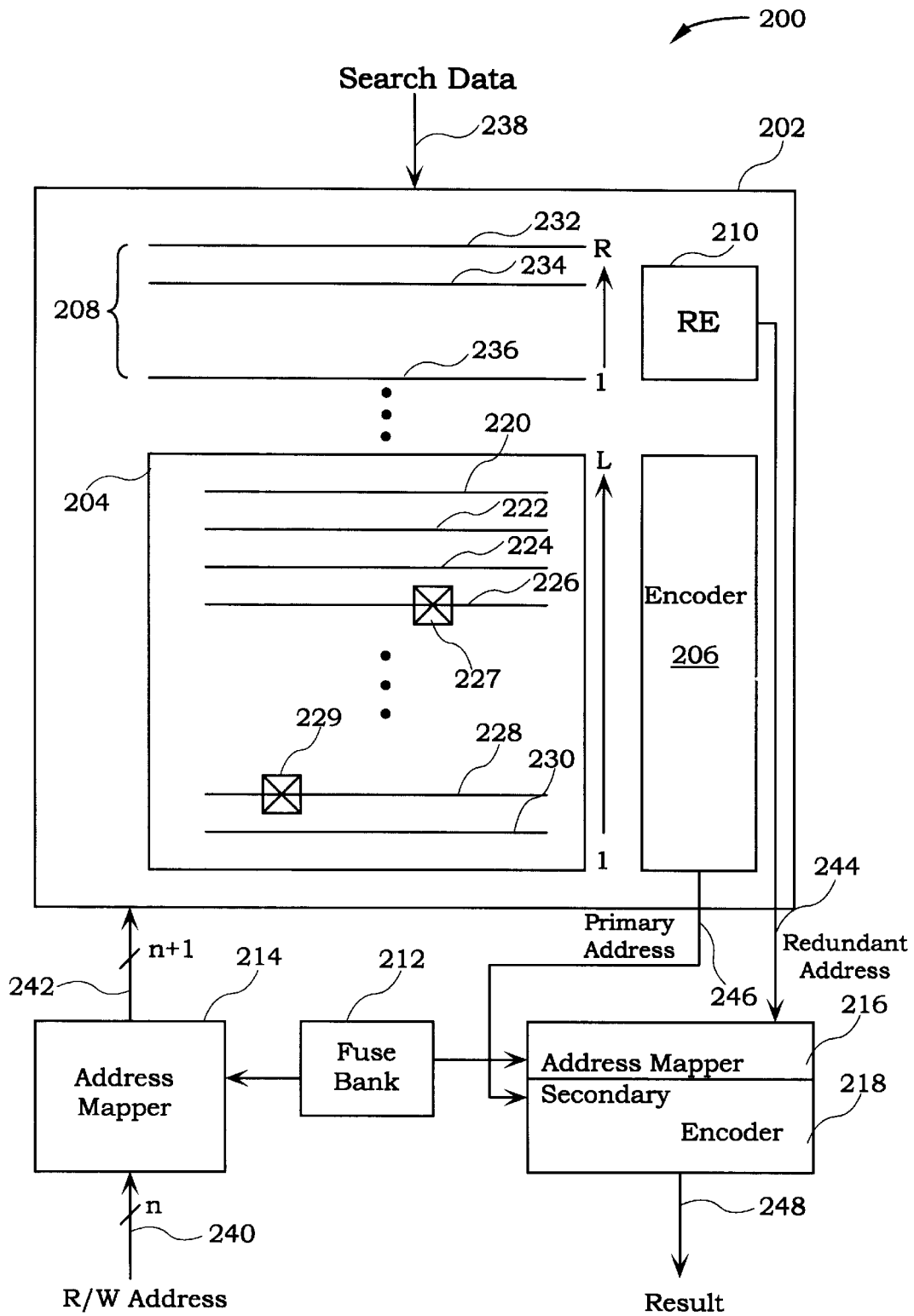
FIG. 2 shows a schematic diagram of a CAM circuit having redundancy in accordance with one embodiment of the present invention.

FIG. 2 shows a schematic diagram of a CAM circuit 200 having a redundancy feature in accordance with one embodiment of the present invention. Within the CAM circuit 200, a CAM array circuitry 202 includes a primary CAM array 204, a primary encoder 206, a redundant CAM array 208, and a redundant encoder (RE) 210. The primary CAM array 204 includes a plurality of entries 220, 222, 224,

226, 228, and 230 for storing data. Each of the entries 220 to 230 includes a plurality of core cells for storing data bits. For example, entry 226 may include core cells to store 16, 32, 64, 128 data bits and the like. As used herein, the number of core cells in an entry is referenced to as the widths of the entry.

Each of the entries 220 to 230 is associated with an address for accessing the entries. For example, a total of L addresses will be needed to uniquely access L entries in the primary CAM array 204, where L is the number of entries in primary address space. As used herein, the addresses needed to uniquely address all the entries in a CAM array is defined as an "address space." Accordingly, the addresses for uniquely accessing all entries 220 to 230 in the primary CAM array 204 define a primary address space.

The redundant CAM array 208 includes a plurality of entries 232, 234, and 236, each of which includes a plurality of core cells for storing data bits. The redundant entries 232, 234, and 236 are configured to store data in lieu of defective entries in the primary CAM array 204. As such, the widths of the primary and redundant entries are preferably identical.

Similar to the primary entries, each of the redundant entries 232, 234, and 236 is associated with an address for accessing the redundant entries. For example, a total of R addresses will be needed to uniquely access R redundant entries in the redundant CAM array 208, where R is the number of addresses in the redundant address space. The addresses for uniquely accessing all entries, 232 to 236, in the redundant CAM array 208 (e.g., addresses 1 to R) define a redundant address space.

When one or more cells in a primary entry is defective, the primary entry may not be used to store data. For example, the primary entries 226 and 228 contain defective used core cells 227 and 229, respectively. In this case, both entries 226 and 228 cannot be used to store data for CAM operations. As used herein, the unusable primary entries 226 and 228 are referred to as defective entries. In place of the defective primary entries 226 and 228, a pair of redundant entries such as entries 234 and 236 is activated to store data that would have been stored in the defective entries 226 and 228.

When the CAM circuit 200 is operating in search mode, the CAM circuit 200 receives a data to be searched over a bus 238. When the search data has been found, which may occur in either or both CAM arrays 204 and 208, all the search results are transmitted to either or both encoders 206 and 210. Specifically, the primary encoder 206 and the redundant encoder 210 receive one or more search results in the form of addresses from the primary and redundant CAM arrays 204, and 208, respectively. Of course, the search may result in finding no address in either array 204 or 208, in which case no search address would be provided by the associated CAM array. When one or more search results are received, however, the primary and redundant encoders, 206 and 210, each selects, for output, a search result having the highest priority in accordance with a specified algorithm The CAM circuit 200 also includes a first address mapper 214, one or more fuse banks 212, a second address mapper 216, and a secondary encoder 218. For mapping between the primary and redundant address spaces, the fuse banks 212 store the addresses of all defective primary entries 226 and 228 and the associated redundant entry addresses 234 and 236. The fuse bank is preferably implemented using a plurality of fuses that are blown in a desired manner to store the addresses for mapping.

The one or more fuse banks 212 are coupled to provide the stored addresses to the address mappers 214 and 216 for address mapping. For a read/write (R/W) operation, the address mapper 214 receives, over an address bus 240, an input R/W address of n-bit width in the primary address space for reading or writing to an entry in the primary CAM array 204. The address mapper 214 then accesses the defective primary addresses stored in one or more fuse banks 212 to determine if the input R/W address matches any of the defective primary addresses. In one embodiment, the address mapper 214 compares the input R/W address with the defective primary addresses on a bit-by-bit basis. If the input R/W address is one of the defective primary addresses stored in one or more fuse banks 212, the address mapper 214 accesses the redundant address associated with the matching defective primary address, stored in the one or more fuse banks, and outputs the accessed redundant address over an address bus 242. In this manner, the address mapper 214 maps the input R/W address onto a redundant address for reading or writing to the redundant address when the matching primary address is defective. Thus, the defective entry in the primary address space is never read or written. On the other hand, if the input R/W address is not one of the defective primary addresses stored in the one or more fuse banks 212, the input R/W address is transmitted to the CAM array circuitry over the bus 242 to access the primary entry indicated by the R/W address.

By way of example, if the input R/W address is an n-bit address representing the address of the primary entry 228, the address mapper 214 checks the one or more fuse banks 212 and determines that the primary entry 228 is a defective entry. It then obtains and provides the associated redundant address from the one or more fuse banks to the CAM array circuitry 202. The data is then read from or written into the redundant entry 236 associated with the redundant address and the defective entry in the primary address space is never read or written. In contrast, if the input R/W address does not correspond to a defective primary entry, the input R/W address is passed through to the CAM array circuitry 202.

To implement mapping in accordance with one embodiment, the address mapper provides an address of (n+1) bit width over address bus 242. The extra one bit is provided to select either the primary or redundant CAM arrays 204 or 208. For example, the extra bit may be asserted if the input R/W address has been mapped to a redundant address. The asserted bit indicates the selection of the redundant CAM array 208. Conversely, the extra bit may be deasserted when the input R/W address has not been mapped to a redundant address. The deasserted bit indicated selection of the primary CAM array 204. Those skilled in the art will recognize that this scheme may also be reversed by deasserting the extra bit for redundant address mapping and asserting the extra bit when the input address has not been mapped. Before the first search operation, preferably after the device is powered on, all defective entries in the primary address space are set to a state which will eliminate their involvement in search operations. For example, they can be loaded with a value which sets them as invalid during a search operation. Since the address mappers prevent all read and write operations to happen to the defective entries, the defective entries will always stay invalid during search operations (i.e., defective entries can never be set as valid).

When a search operation is performed on the CAM circuit 200 by providing a search data over the bus 238, the CAM circuit 200 searches for the search data in the primary and redundant CAM arrays 204 and 208. The addresses of the search data found in the redundant and primary CAM arrays 204 and 208, if any, are then provided as search results to the redundant and primary encoders 210 and 206. The search result(s) from the redundant CAM array 208 are provided to the redundant encoder 210 while the search result(s) from the primary CAM array 204 are provided to the primary encoder 206. The redundant encoder 210 selects one of the search results from the redundant CAM array 208. The primary encoder 206 selects one of the search results from the primary CAM array 204.

The search result (i.e., address), if any, from the redundant encoder 210 is provided via redundant address bus 244 to the address mapper 216, which performs a reverse address mapping from the redundant address space to the primary address space. Specifically, the address mapper 216 accesses and searches the one or more fuse banks 212 to find a redundant addresses that matches the redundant search result by comparing the redundant search result with the stored redundant addresses. Preferably, the comparison is performed on a bit-by-bit basis. When the matching redundant address has been found, the address mapper 216 obtains and outputs the primary address associated with the matched redundant address from the one or more fuse banks 212. If no matching redundant address is found, an error condition may be generated to indicate an invalid redundant address. The primary address mapped from the redundant search result is then provided to the secondary encoder 218.

The secondary encoder 218 receives the search result from the primary encoder 206 over an address bus 246 and the mapped redundant search result from the address mapper 216. It then selects one of the search results in accordance with a predetermined algorithm and outputs the selected search result over result bus 248. It should be appreciated that the output search result is in the form of an address in the primary address space.

Figure 3:
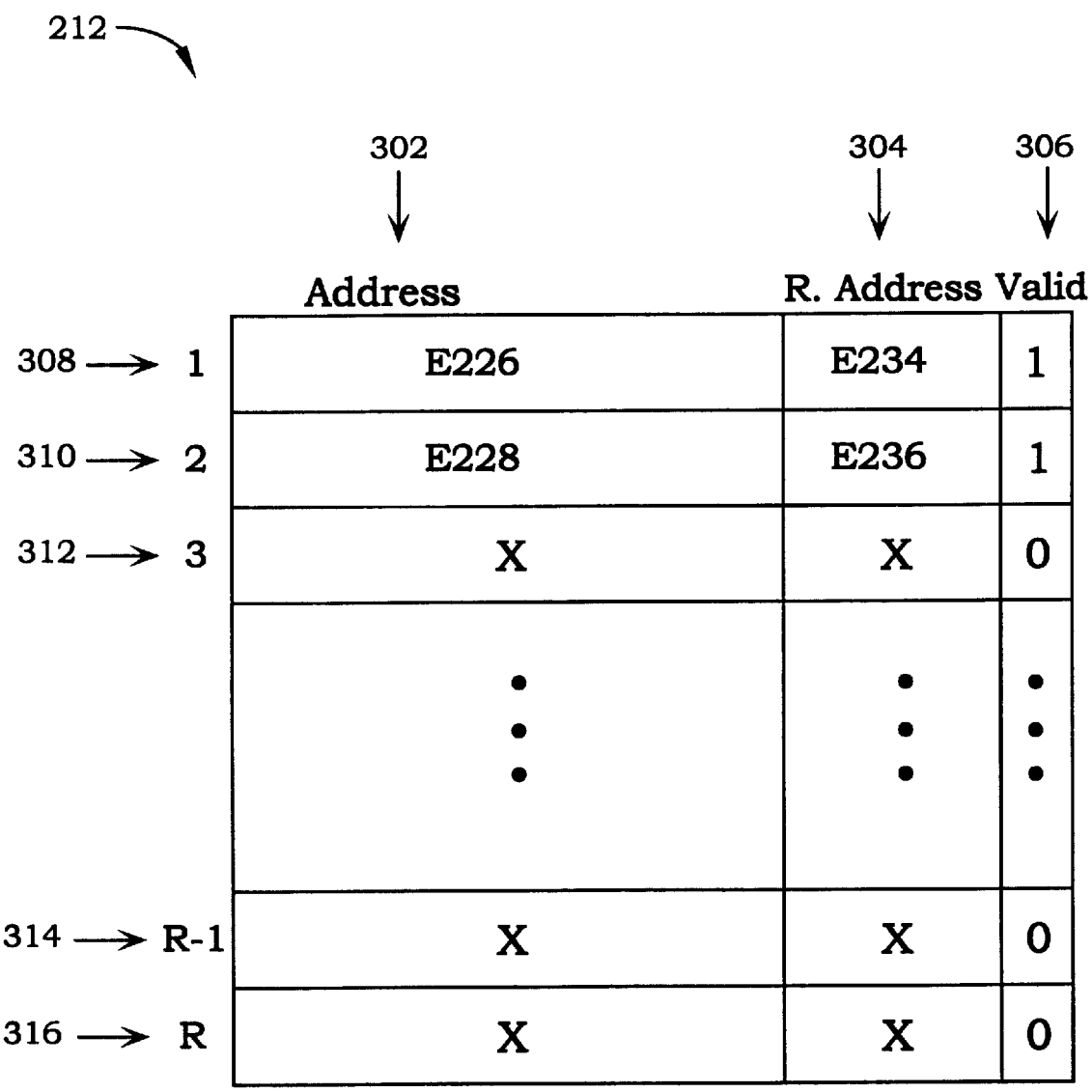
FIG. 3 illustrates a detailed schematic diagram of a fuse bank in accordance with one embodiment of the present invention.

FIG. 3 illustrates a more detailed schematic diagram of an exemplary fuse bank 212 in accordance with one embodiment of the present invention. The fuse bank 212 includes R entries from entry I to entry R. Each entry includes a primary address field 302, a redundant address field 304, and a valid bit field 306. The primary address field 302 in an entry is capable of storing one defective primary address. Likewise, the redundant address field 304 in an entry is capable of storing one redundant address that is to be used in place of the defective primary address in the same entry. If the primary address field 302 is n bits wide and the redundant address field 304 is m bits wide, each entry would have n+m bits total. However, the fuse bank 212 may be used for any address spaces by providing sufficient widths to accommodate the addressing requirements of each address space. Those skilled in the art will recognize that the fuse bank can be replaced by one or more storage devices or elements such as register files, read only memories (ROMs), random access memories (RAMs), etc.

The valid bit field 306 is arranged to store a valid bit indicating whether the associated entry is valid or not. That is, if the valid bit is asserted, it indicates that the primary and redundant addresses in the same entry are valid entries for mapping. Otherwise, the primary and redundant addresses are not valid addresses and hence they should not be used for mapping. When all valid bits are deasserted, the redundant CAM array 208 is effectively disabled altogether.

As shown in FIG. 3, the fuse bank 212 includes two valid entries 308 and 310 as indicated by the valid bits. Other entries 312, 314, and 316 are invalid entries and thus are not used for mapping. However, they may be used for mapping any new defective primary entries by storing the addresses of the new defective entries. In this configuration, the entry 308 stores information for mapping primary entry 226 and redundant entry 234. The stored primary and redundant addresses are indicated as E226 and E234, respectively. Similarly, the entry 310 stores information for mapping primary entry 228 and redundant entry 236. The stored primary and redundant addresses are indicated as E228 and E236, respectively.

The present invention thus provides a CAM circuit and method for providing redundancy. By thus providing a redundant CAM array and a redundant encoder, the primary CAM and encoders are left undisturbed. In addition, the CAM circuit and method of the present invention perform address mapping transparently so that the encoder is not burdened with the task of keeping track of redundant addresses. Accordingly, the CAM circuit and method with the redundancy allow substantial increase in CAM chip yield with the attendant savings in cost.

It should be understood that the various block diagrams may be embodied in any form which may include, for example, any suitable semiconductor substrate, printed circuit board, packaged integrated circuit, or software implementation. Accordingly, those skilled in the art will recognize that the present embodiments are to be considered as illustrative and not restrictive, and the invention is not to be limited to the details given herein, but may be modified within the scope and equivalents of the appended claims.

What is claimed is:

1. A content addressable memory circuit having a redundant array, comprising:
   a first content addressable memory array for storing data, the first content addressable memory array having a plurality of first entries, each first entry having a plurality of first memory cells, wherein any first entry that includes one or more defective first memory cells is defective;
   a redundant content addressable memory array having one or more redundant entries of redundant memory cells, each of the one or more redundant entries having a redundant address and being associated with a defective first entry, wherein each redundant entry is configured to store data for the associated first entry;
   one or more storage devices for associating each of the defective first entries with a redundant entry;
   a first encoder for outputting a first search result from the first content addressable memory array; and
   a redundant encoder for outputting a redundant search result from the redundant content addressable memory array.

2. The content addressable memory circuit as recited in claim 1, further comprising:
   a first address mapper for accessing one of the entries of the first and redundant content addressable memory arrays in response to a read/write address;
   a second address mapper for mapping the redundant search result onto the associated defective first entry so as to generate a second search result; and
   a secondary encoder coupled to receive the first and second search results, the secondary encoder selecting and outputting one of the search results as an output result.

3. The content addressable memory circuit as recited in claim 2, wherein the read/write address is an address for accessing a selected first entry and wherein the address mapper accesses the one or more storage devices and maps the read/write address onto a redundant entry associated with selected first entry when the selected first entry is defective.

4. The content addressable memory circuit as recited in claim 2, wherein the second address mapper maps the redundant search result to the associated defective first entry by accessing the one or more storage devices.

5. The content addressable memory circuit as recited in claim 1, wherein the one or more storage devices store addresses of the defective first entries and the associated redundant entries.

6. The content addressable memory circuit as recited in claim 5, wherein the one or more storage devices store a valid bit for each of the defective first entries for disabling access to the associated redundant array.

7. The content addressable memory circuit as recited in claim 1, wherein the one or more storage devices are one or more fuse banks.

8. The content addressable memory circuit as recited in claim 5, wherein the redundant and first encoders are arranged to receive one or more search addresses from the redundant and first content addressable memory arrays, respectively, wherein the redundant and first encoder are each configured to select a search address having the highest priority for output as the redundant and first search results, respectively, and wherein the highest priority is determined in accordance with a specified algorithm.

9. A content addressable memory circuit having a redundant array, comprising:
  a primary content addressable memory array for storing data, the primary content addressable memory array having a plurality of primary entries, the primary entries being addressable by a plurality of primary addresses that defines a primary address space, one primary address for each primary entry;
  a redundant content addressable memory array having a set of redundant entries, the redundant entries being addressable by a set of redundant addresses that defines a redundant address space, one redundant address for each redundant entry, wherein each redundant entry is configured to store data for a defective primary entry;
  one or more storage devices for storing the redundant addresses and the primary addresses of one or more defective primary entries, the one or more storage devices associating the primary addresses of the defective primary entries with the redundant addresses for mapping between the primary and redundant address spaces;
  a primary encoder coupled to receive one or more primary addresses from the primary content addressable memory array and outputting a selected primary address as a primary search result; and
  a redundant encoder coupled to receive one or more redundant addresses from the redundant content addressable memory array and outputting a selected redundant address as a redundant search result.

10. The content addressable memory circuit as recited in claim 9, further comprising:
  a primary address mapper for converting an input address in the primary address space into an associated redundant address in the redundant address when the input address corresponds to a defective primary entry;
  a redundant address mapper for converting the redundant search result into the associated defective primary entry so as to generate a second search result; and
  a secondary encoder coupled to receive the primary and second search results, the secondary encoder selecting and outputting one of the search results as an output result according to a specified algorithm.

11. The content addressable memory circuit as recited in claim 10, wherein the primary address mapper receives the input address for performing a read/write operation.

12. The content addressable memory circuit as recited in claim 10, wherein the input address is an address for accessing a selected primary entry and wherein the primary address mapper accesses the one or more storage devices and maps the input address onto a redundant entry associated with selected primary entry when the selected primary entry is defective.

13. The content addressable memory circuit as recited in claim 10, wherein the redundant address mapper maps the redundant search result to the associated defective primary entry by accessing the storage device.

14. The content addressable memory circuit as recited in claim 10, wherein the storage device stores a valid bit for each of the defective primary entries for disabling access to the associated redundant array.

15. The content addressable memory circuit as recited in claim 10, wherein the redundant and primary encoders are arranged to receive one or more search addresses from the redundant and primary content addressable memory arrays, respectively, wherein the redundant and primary encoder are each configured to select a search address for output as the redundant and primary search results, respectively, according to a specified algorithm.

16. The content addressable memory circuit as recited in claim 9, wherein the one or more storage devices are one or more fuse banks, RAM devices, or ROM devices.

17. A method for providing a redundant array for a content addressable memory circuit, the content addressable memory circuit including a primary content addressable memory array and a primary encoder, the primary content addressable memory array having a plurality of primary entries for storing data according to a specified algorithm, the primary entries being addressable by a plurality of primary addresses that defines a primary address space, one primary address for each primary entry, the primary encoder outputting a selected primary address as a primary search result, the method comprising:
  providing a redundant content addressable memory array having a set of redundant entries, the redundant entries being addressable by a set of redundant addresses that defines a redundant address space, one redundant address for each redundant entry, wherein each redundant entry is configured to store data for a defective primary entry;
  storing the redundant addresses and the primary addresses of one or more defective primary entries in one or more storage devices, the one or more storage devices associating the primary addresses of the defective primary entries with the redundant addresses for between the primary and redundant address spaces;
  providing a redundant encoder coupled to receive one or more redundant addresses from the redundant content addressable memory array and outputting a selected redundant address as a redundant search result according to the specified algorithm.

18. The method as recited in claim 17, further comprising:
  providing a primary address mapper for converting an input address in the primary address space into an associated redundant address in the redundant address when the input address corresponds to a defective primary entry;
  providing a redundant address mapper for converting the redundant search result into the associated defective primary entry address so as to generate a second search result; and providing a secondary encoder coupled to receive the primary and second search results, the secondary encoder selecting and outputting one of the search results as an output result.

19. The method as recited in claim 18, wherein the primary address mapper receives the input address for performing a read/write operation.

20. The method as recited in claim 18, wherein the input address is an address for accessing a selected primary entry and wherein the primary address mapper accesses the one or more storage devices and maps the input address onto a redundant entry associated with selected primary entry when the selected primary entry is defective.

21. The method as recited in claim 18, wherein the redundant address mapper maps the redundant search result to the associated defective primary entry address by accessing the one or more storage devices.

22. The method as recited in claim 18, wherein the one or more storage devices store a valid bit for each of the defective primary entries for disabling access to the associated redundant array.

23. The method as recited in claim 18, wherein the redundant and primary encoders are arranged to receive one or more search addresses from the redundant and primary content addressable memory arrays, respectively, wherein the redundant and primary encoder are each configured to select a search address according to the specified algorithm for output as the redundant and primary search results, respectively.

24. The method as recited in claim 17, wherein the one or more storage devices are one or more fuse banks, RAM devices, or ROM devices.

* * * * *